(12) United States Patent
Schowalter

(10) Patent No.: US 11,990,562 B1
(45) Date of Patent: May 21, 2024

(54) ULTRAVIOLET LIGHT-EMITTING DEVICES HAVING ENHANCED LIGHT OUTPUT

(71) Applicant: Leo J. Schowalter, Latham, NY (US)

(72) Inventor: Leo J. Schowalter, Latham, NY (US)

(73) Assignee: CRYSTAL IS, INC., Green Island, NY (US)

(*) Notice: Subject to any disclaimer, the term of this patent is extended or adjusted under 35 U.S.C. 154(b) by 302 days.

(21) Appl. No.: 17/494,905

(22) Filed: Oct. 6, 2021

Related U.S. Application Data

(60) Provisional application No. 63/088,485, filed on Oct. 7, 2020.

(51) Int. Cl.
| | |
|---|---|
| *H01L 33/06* | (2010.01) |
| *H01L 33/00* | (2010.01) |
| *H01L 33/32* | (2010.01) |
| *H01L 33/40* | (2010.01) |

(52) U.S. Cl.
CPC .......... *H01L 33/06* (2013.01); *H01L 33/0075* (2013.01); *H01L 33/32* (2013.01); *H01L 33/405* (2013.01); *H01L 2933/0016* (2013.01)

(58) Field of Classification Search
CPC ..... H01L 33/06; H01L 33/32; H01L 33/0075; H01L 33/405; H01L 2933/0016
See application file for complete search history.

(56) References Cited

U.S. PATENT DOCUMENTS

| | | | |
|---|---|---|---|
| 5,880,491 A * | 3/1999 | Soref | H01L 33/007 257/190 |
| 9,680,057 B2 * | 6/2017 | Moe | H01L 33/32 |
| 11,211,525 B2 * | 12/2021 | Rajan | H01L 33/385 |
| 11,251,330 B2 * | 2/2022 | Grandusky | H01L 33/32 |
| 11,355,664 B2 * | 6/2022 | Grandusky | H01L 21/7806 |
| 2010/0219395 A1 * | 9/2010 | Hirayama | H01L 33/14 438/47 |
| 2011/0177678 A1 * | 7/2011 | Ohno | B82Y 20/00 977/755 |

* cited by examiner

*Primary Examiner* — Savitri Mulpuri
(74) *Attorney, Agent, or Firm* — Morgan, Lewis & Bockius LLP

(57) ABSTRACT

In various embodiments, device structures configured to emit ultraviolet light have lateral surfaces that form angles to the substrate normal of approximately the Brewster angle corresponding to the light-emitting portion of the device structure. The device structures may include one or more mesas disposed over a shared substrate or handle wafer.

14 Claims, 4 Drawing Sheets

ULTRAVIOLET LIGHT-EMITTING DEVICES HAVING ENHANCED LIGHT OUTPUT

RELATED APPLICATIONS

This application claims the benefit of and priority to U.S. Provisional Patent Application No. 63/088,485, filed Oct. 7, 2020, the entire disclosure of which is hereby incorporated herein by reference.

TECHNICAL FIELD

In various embodiments, the present invention relates to ultraviolet optoelectronic devices, in particular to improving light extraction therefrom at short wavelengths.

BACKGROUND

The output powers, efficiencies, and lifetimes of short-wavelength ultraviolet light-emitting diodes (UV LEDs), i.e., LEDs that emit light at wavelengths shorter than 350 nm, based on the nitride semiconductor system, remain limited due to high defect levels in the active region. These limitations are particularly problematic (and notable) in devices designed to emit at wavelengths shorter than 270 nm. Most development effort has been carried out on devices formed on foreign substrates such as sapphire where defect densities remain high despite innovative defect reduction strategies. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces bonded to a polycrystalline (ceramic) AlN submount. Because of the high crystalline perfection that is achievable in the active device region of such devices, internal efficiencies greater than 60% have been demonstrated. Unfortunately, the photon-extraction efficiency is often still very poor in these devices, ranging from about 4% to about 15% achieved using surface-patterning techniques.

For several reasons, the photon extraction efficiency from short-wavelength UV LEDs is poor compared to visible LEDs. Thus, the current generation of short-wavelength UV LEDs has low wall-plug efficiencies (WPE) of, at best, only a few percent, where WPE is defined as the ratio of usable optical power (in this case, emitted UV light) achieved from the diode divided by the electrical power into the device. The WPE of an LED can be calculated by taking the product of the electrical efficiency ($\eta_{el}$), the photon extraction efficiency ($\eta_{ex}$), and the internal efficiency (IE); i.e., WPE=$\eta_{el}\times\eta_{ex}\times$IE. The IE itself is the product of current injection efficiency ($\eta_{inj}$) and the internal quantum efficiency (IQE); i.e., IE=$\eta_{inj}\times$IQE. Thus, a low $\eta_{ex}$ will deleteriously impact the WPE even after the IE has been improved via the reduction of internal crystalline defects enabled by, e.g., the use of the AlN substrates referenced above as platforms for the devices.

Several issues can contribute to low photon-extraction efficiency. First, even the highest-quality AlN substrates available generally have some absorption in the UV wavelength range, even at wavelengths longer than the band edge in AlN (which is approximately 210 nm). This absorption tends to result in some of the UV light generated in the active area of the device being absorbed in the substrate, thereby diminishing the amount of light emitted from the substrate surface. Additionally, UV LED efficiency suffers because approximately half of the generated photons are directed toward the p-contact and absorbed by the p-GaN of that contact. Even when photons are directed toward the AlN surface, only 9.4% can escape from an untreated surface due to the large index of refraction of the AlN, which results in a small escape cone. Additional photons are lost on their way to the exit surface due to absorption in the AlN wafer. These losses are multiplicative and the average photon extraction efficiency is only about 2.5%.

Photon extraction-related losses are only exacerbated as UV LEDs are configured to emit light at wavelengths shorter than approximately 240 nm. Unlike GaN, AlN has a large negative crystal-field splitting energy. Thus, in AlN and AlGaN having high Al content (e.g., Al content greater than approximately 80%), the polarization of photons resulting from electron-hole recombination transitions from mainly polarized with the electric field perpendicular to the c-axis of the substrate (i.e., transverse-electric, or TE, polarized) to mainly polarized with the electric field parallel to the c-axis of the substrate (i.e., transverse-magnetic, or TM, polarized). This phenomenon mainly results from the crystal-field split-off hole band being the topmost valence band.

At shorter wavelengths, the photons created in UV LEDs are increasingly TM-polarized, and such photons are difficult to extract from the device. Since TM-polarized photons propagate in a direction parallel to the c-plane substrate surface, even substrate removal schemes or surface roughening may be inadequate to sufficiently out-couple such photons. Thus, there is a need for improved UV LED device structures capable of emitting at short wavelengths (e.g., wavelengths of approximately 240 nm or less) with high photon-extraction efficiencies.

SUMMARY

In various embodiments of the present invention, the photon-extraction efficiency and external quantum efficiency of UV light-emitting devices such as UV LEDs are improved via patterning techniques, customized for the intended wavelength of UV emission, that promote lateral emission from the UV device. In various embodiments, a UV light-emitting device structure configured for emission at a particular desired UV wavelength is formed over a substrate (e.g., a single-crystal AlN substrate). The device structure is subsequently patterned to form one or more mesas having lateral surfaces that form angles to the substrate normal of approximately the Brewster angle corresponding to the light-emitting device structure. In alternative embodiments, the device structure is grown over a patterned substrate (e.g., a single-crystal AlN substrate), and the epitaxial growth is controlled such that the device structure grows over mesas or other substrate features in discrete portions each having lateral surfaces forming angles to the substrate normal of approximately the Brewster angle corresponding to the light-emitting device structure. Multiple mesas or individual device structures fabricated over a single substrate in accordance with embodiments of the invention may subsequently be electrically coupled to shared device contacts such that individual "devices" emit light from multiple different mesas or features.

As known to those of skill in the art, the Brewster angle corresponds to the angle of incidence at which polarized light is transmitted through a surface without reflection. The Brewster angle may be calculated using the formula:

$$\theta_B = \tan^{-1}\frac{n_2}{n_1}$$

where $\theta_B$ is the Brewster angle, $n_1$ is the refractive index of the medium through which the light initially propagates, and $n_2$ is the refractive index of the medium into which the light is emitted. For many UV light-emitting devices in accordance with embodiments of the invention, $n_2$ is equal to 1, as the UV light is being emitted into air. As utilized herein, angles of "approximately the Brewster angle" correspond to the Brewster angle ±5°, ±2°, ±1°, or ±0.5°. In an exemplary embodiment, an AlGaN device structure fabricated on an AlN substrate and configured to emit light at 230 nm has a Brewster angle of about 21.7°. Indices of refraction of nitride layers such as AlN and AlGaN (i.e., of varying Al content), as a function of wavelength, and therefore Brewster angles, may be straightforwardly determined by those of skill in the art via, for example, spectroscopic ellipsometry measurements (using, e.g., the UVISEL 2 VUV spectroscopic ellipsometer available from Horiba, Ltd. of Kyoto, Japan).

Thus, UV light-emitting devices in accordance with embodiments of the invention exhibit enhanced light output, as TM-polarized photons may be efficiently transmitted from the angled sidewalls of the device. Moreover, the laterally emitted photons tend to be emitted from the device sidewall at a non-zero angle thereto, and thus one or more reflectors may be disposed between mesas or device features to redirect the laterally emitted light in a vertical direction out of the device. Selection of the sidewall angle as detailed herein maximizes lateral emission directly from the mesas or features of the device, and emission efficiency is improved because such photons are not reflected from the sidewall toward the device cap layer or underlying substrate, either of which may absorb at least a portion of such light.

In addition, TE-polarized photons may still be vertically emitted from devices in accordance with embodiments of the invention, as in conventional UV light-emitting devices. This combined with the efficient emission of TM-polarized photons greatly increases the external quantum efficiency of devices in accordance with embodiments of the invention. Techniques detailed herein may be combined with conventional substrate roughening techniques that enhance photon emission from device or substrate surfaces, and such techniques may be applied to top, bottom, and/or sidewall surfaces of devices in accordance with embodiments of the present invention.

In various embodiments, particularly in devices and structures configured to emit UV light at very short wavelengths, conventional substrate thinning or removal may be unnecessary, due to the large proportion of TM-polarized photons generated therein. While various embodiments of the invention may include such substrate removal or thinning in order to promote emission of the TE-polarized photons that are generated, in some embodiments any increase in efficiency resulting from such removal or thinning may not justify the additional process complexity (and expense) associated with substrate removal or thinning. In embodiments in which the substrate is not removed or thinned, the substrate may still be textured (e.g., roughened) and/or coated in order to further enhance photon extraction therefrom.

References made herein to AlGaN or $Al_{1-a}Ga_aN$ alloys and layers (a being any subscript that may be provided in references to AlGaN herein) are understood to optionally include indium (In) unless the alloy or layer in question is specifically described as being substantially free of In; thus, references made herein to AlGaN or $Al_{1-a}Ga_aN$ are understood to be equivalent to AlInGaN or $Al_{1-a-b}Ga_aIn_bN$ unless otherwise specified. As utilized herein, a layer or alloy being "substantially free of In" means that the layer or alloy is free of In in any but trace amounts, which may be detectable via chemical analysis but do not affect band gap or other properties of the layer or alloy by more than 1% (or, in some embodiments, by more than 0.5% or by more than 0.1%). As utilized herein, an "undoped" layer or substrate is not intentionally doped, and/or has a resistivity of at least 100,000 ohm·cm, and/or has a dopant concentration of approximately $3\times10^{17}$ cm$^{-3}$ or less, approximately $1\times10^{17}$ cm$^{-3}$ or less, approximately $5\times10^{16}$ cm$^{-3}$ or less, approximately $3\times10^{16}$ cm$^{-3}$ or less, or approximately $1\times10^{16}$ cm$^{-3}$ or less. As utilized herein, a "doped" layer or substrate has a resistivity of at most 50,000 ohm·cm, or at most 30,000 ohm·cm, or at most 10,000 ohm·cm, or at most 5,000 ohm·cm, or at most 1,000 ohm·cm, and/or has a dopant concentration of approximately $1\times10^{18}$ cm$^{-3}$ or more, or approximately $1\times10^{19}$ cm$^{-3}$ or more, or approximately $1\times10^{20}$ cm$^{-3}$ or more.

In an aspect, embodiments of the invention feature an ultraviolet (UV) light-emitting device that includes, consists essentially of, or consists of a substrate, a bottom contact layer disposed over the substrate, a light-emitting device structure disposed over the bottom contact layer, and a cap layer disposed over the multiple-quantum well layer and/or the light-emitting device structure. The substrate has an $Al_uGa_{1-u}N$ top surface, where $0.4 \leq u \leq 1.0$. The bottom contact layer includes, consists essentially of, or consists of $Al_nGa_{1-n}N$. The light-emitting device structure includes, consists essentially of, or consists of a multiple-quantum well layer having a plurality of periods each including, consisting essentially of, or consisting of a strained $Al_xGa_{1-x}N$ barrier and a strained $Al_yGa_{1-y}N$ quantum well, where (i) y is less than x by an amount facilitating confinement of charge carriers in the multiple-quantum well layer, and (ii) y is selected such that light emitted by the multiple-quantum well layer has a wavelength of approximately 240 nm or shorter. The cap layer includes, consists essentially of, or consists of $Al_wGa_{1-w}N$, where $0 \leq w \leq 0.2$. At least a portion of a sidewall of the light-emitting device structure is angled with respect to a normal to the top surface of the substrate at an angle of approximately a Brewster angle of the light emitted by the multiple-quantum well layer.

Embodiments of the invention may include one or more of the following in any of a variety of combinations. The substrate may include, consist essentially of, or consist of doped or undoped AlN. Y may be selected such that light emitted by the multiple-quantum well layer has a wavelength of approximately 210 nm or longer. The light-emitting device structure may be disposed within or as a mesa disposed over the substrate and having the sidewall angle. The device may include a conductive bottom contact disposed over at least a portion of the bottom contact layer and around at least a portion of a base of the mesa. The device may include a UV reflector disposed over at least a portion of the bottom contact. The UV reflector may include, consist essentially of, or consist of aluminum. The device may include a conductive top contact disposed over the cap layer.

In another aspect, embodiments of the invention feature an ultraviolet (UV) light-emitting device that includes, consists essentially of, or consists of a substrate, a bottom contact layer disposed over the substrate, and a plurality of mesas disposed over the bottom contact layer. The substrate has an $Al_uGa_{1-u}N$ top surface, where $0.4 \leq u \leq 1.0$. The bottom contact layer includes, consists essentially of, or consists of $Al_nGa_{1-n}N$. Each of the mesas includes, consists essentially of, or consists of a light-emitting device structure and a cap layer disposed over the light-emitting device structure. The light-emitting device structure includes, consists essentially of, or consists of a multiple-quantum well layer having a plurality of periods each including, consisting essentially of, or consisting of a strained $Al_xGa_{1-x}N$ barrier and a strained $Al_yGa_{1-y}N$ quantum well, where (i) y is less than x by an amount facilitating confinement of charge carriers in the multiple-quantum well layer, and (ii) y is selected such that light emitted by the multiple-quantum well layer has a wavelength of approximately 240 nm or shorter. The cap layer includes, consists essentially of, or consists of $Al_wGa_{1-w}N$, where $0 \leq w \leq 0.2$. At least a portion of a sidewall of each of the mesas is angled with respect to a normal to the top surface of the substrate at an angle of approximately a Brewster angle of the light emitted by the multiple-quantum well layer.

Embodiments of the invention may include one or more of the following in any of a variety of combinations. The substrate may include, consist essentially of, or consist of doped or undoped AlN. Y may be selected such that light emitted by the multiple-quantum well layer has a wavelength of approximately 210 nm or longer. The device may include a conductive top contact disposed over the cap layer of each of the mesas. The cap layers of the mesas may be electrically coupled together. The device may include a conductive bottom contact disposed over at least a portion of the bottom contact layer and extending around at least a portion of a base of each of the mesas. The device may include a UV reflector disposed over at least a portion of the bottom contact. The UV reflector may include, consist essentially of, or consist of aluminum.

In yet another aspect, embodiments of the invention feature an ultraviolet (UV) light-emitting device that includes, consists essentially of, or consists of a handle wafer having a top surface, a cap layer disposed over the handle wafer, a first conductive contact electrically coupled to the cap layer, a light-emitting device structure disposed over the cap layer, and a contact layer disposed over the light-emitting device structure. The cap layer includes, consists essentially of, or consists of $Al_wGa_{1-w}N$, where $0 \leq w \leq 0.2$. The light-emitting device structure includes, consists essentially of, or consists of a multiple-quantum well layer having a plurality of periods each including, consisting essentially of, or consisting of a strained $Al_xGa_{1-x}N$ barrier and a strained $Al_yGa_{1-y}N$ quantum well, where (i) y is less than x by an amount facilitating confinement of charge carriers in the multiple-quantum well layer, and (ii) y is selected such that light emitted by the multiple-quantum well layer has a wavelength of approximately 240 nm or shorter. The contact layer includes, consists essentially of, or consists of $Al_nGa_{1-n}N$. At least a portion of a sidewall of the light-emitting device structure is angled with respect to a normal to the top surface of the handle wafer at an angle of approximately a Brewster angle of the light emitted by the multiple-quantum well layer.

Embodiments of the invention may include one or more of the following in any of a variety of combinations. Y may be selected such that light emitted by the multiple-quantum well layer has a wavelength of approximately 210 nm or longer. The device may include a second conductive contact electrically coupled to the contact layer. The device may include a UV reflector disposed over at least a portion of the first conductive contact. The UV reflector may include, consist essentially of, or consist of aluminum.

In another aspect, embodiments of the invention feature a method of fabricating an ultraviolet (UV) light-emitting device. An epitaxial structure is provided. The epitaxial structure includes, consists essentially of, or consists of a substrate, a bottom contact layer disposed over the substrate, a light-emitting device structure disposed over the bottom contact layer, and a cap layer disposed over the multiple-quantum well layer. The substrate has an $Al_uGa_{1-u}N$ top surface, where $0.4 \leq u \leq 1.0$. The bottom contact layer includes, consists essentially of, or consists of $Al_nGa_{1-n}N$. The light-emitting device structure includes, consists essentially of, or consists of a multiple-quantum well layer having a plurality of periods each including, consisting essentially of, or consisting of a strained $Al_xGa_{1-x}N$ barrier and a strained $Al_yGa_{1-y}N$ quantum well, where (i) y is less than x by an amount facilitating confinement of charge carriers in the multiple-quantum well layer, and (ii) y is selected such that light emitted by the multiple-quantum well layer has a wavelength of approximately 240 nm or shorter. The cap layer includes, consists essentially of, or consists of $Al_wGa_{1-w}N$, where $0 \leq w \leq 0.2$. A Brewster angle of the light emitted by the multiple-quantum well layer is determined. The epitaxial structure is patterned to form over the substrate one or more mesas each having a sidewall revealing the light-emitting device structure. At least a portion of each sidewall is angled with respect to a normal to the top surface of the substrate at an angle of approximately the Brewster angle.

Embodiments of the invention may include one or more of the following in any of a variety of combinations. Forming the one or more mesas may include, consist essentially of, or consist of plasma etching the epitaxial structure. After the plasma etching, the angle of the sidewall may not be equal to the Brewster angle. After the plasma etching, the sidewall may be wet etched to adjust the angle of the sidewall until the angle of the sidewall is approximately equal to the Brewster angle. The wet etching may be performed with an etchant including, consisting essentially of, or consisting of tetramethylammonium hydride. Determining the Brewster angle may include, consist essentially of, or consist of measuring a refractive index of at least a portion of the light-emitting device structure. The refractive index may be measured using spectroscopic ellipsometry. The one or more mesas may include, consist essentially of, or consist of a plurality of mesas. A UV reflector may be formed (e.g., deposited) over the substrate between the mesas. The UV reflector may include, consist essentially of, or consist of aluminum. Y may be selected such that light emitted by the multiple-quantum well layer has a wavelength of approximately 210 nm or longer.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean ±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
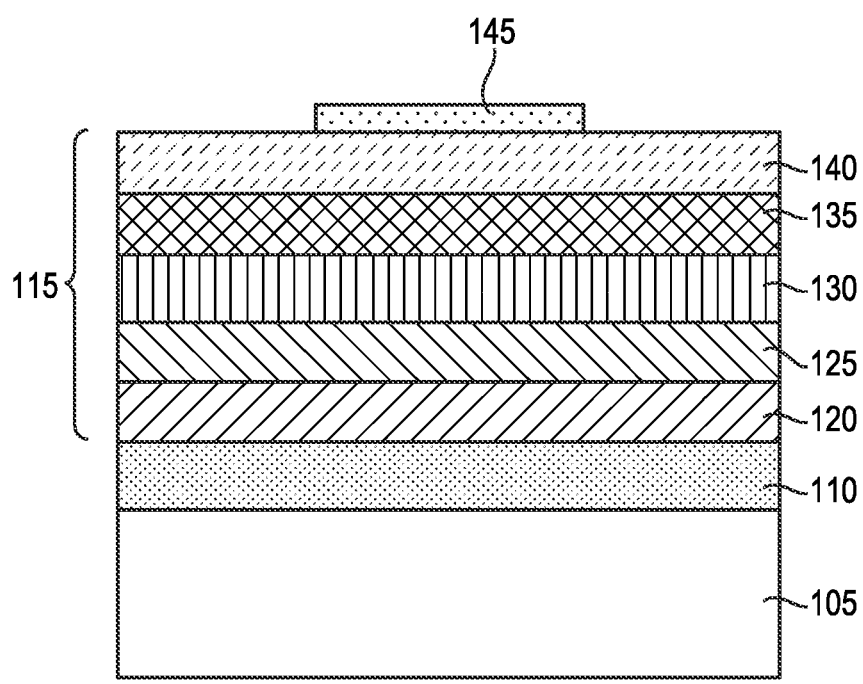
FIG. 1 is a schematic cross-section of a light-emitting device structure in accordance with various embodiments of the invention.

FIG. 1 schematically depicts a light-emitting device structure 100 in accordance with embodiments of the present invention. Light-emitting device structures 100 in accordance with embodiments of the invention may include, consist essentially of, or consist of, for example, light-emitting diodes or lasers. Lasing in laser structures may be facilitated via the formation of partially reflective facets on the sidewalls of the structure, and/or vertically emitting lasers may be formed via, e.g., inclusion of reflectors (e.g., Bragg reflectors) above and/or below the light-emitting quantum well structure.

As shown, the device structure 100 includes a substrate 105, which in various embodiments includes, consists essentially of, or consists of aluminum nitride, e.g., single-crystal aluminum nitride. In various embodiments, the substrate 105 is not transparent (or not completely transparent) to radiation emitted by the device structure 100 (e.g., UV radiation), and thus removal of all or a portion of the substrate 105 may improve the extraction of vertically emitted photons (e.g., TE-polarized light) from the device structure 100. Substrate 105 may be miscut such that the angle between its c-axis and its surface normal is between approximately 0° and approximately 4°. In various embodiments, the misorientation of the surface of substrate 105 is less than approximately 0.3°, e.g., for substrates 105 that are not deliberately or controllably miscut. In other embodiments, the misorientation of the surface of substrate 105 is greater than approximately 0.3°, e.g., for substrates 105 that are deliberately and controllably miscut. In various embodiments, the direction of the miscut is towards the a-axis. In accordance with embodiments of the invention, substrates 105 that are not intentionally miscut may be assumed to have a surface corresponding approximately to the c-plane.

The surface of substrate 105 may have a group-III (e.g., Al-) polarity, and may be planarized, e.g., by chemical-mechanical polishing. The RMS surface roughness of substrate 105 may be less than approximately 0.5 nm for a 10 μm×10 μm area. In some embodiments, atomic-level steps are detectable on the surface when probed with an atomic-force microscope. The threading dislocation density of substrate 105 may be measured using, e.g., etch pit density measurements after a 5 minute KOH—NaOH eutectic etch at 450° C. In various embodiments, the threading dislocation density is less than approximately $2\times10^3$ cm$^{-2}$. In some embodiments substrate 105 has an even lower threading dislocation density. Substrate 105 may be topped with a homoepitaxial layer (not shown) that includes, consists essentially of, or consists of doped or undoped AlN.

The various layers of device structure 100 disposed over substrate 105 may be formed by any of a variety of different techniques, e.g., epitaxial growth techniques such as chemical vapor deposition (CVD) methods such as metalorganic CVD (MOCVD).

In accordance with embodiments of the present invention, a release layer 110 may be disposed over the substrate 105 to facilitate later removal of all or a portion of the substrate 105 from the rest of device structure 100, as described in U.S. patent application Ser. No. 15/977,031, filed on May 11, 2018, the entire disclosure of which is incorporated by reference herein. In various embodiments, the release layer 110 is substantially lattice-matched to the substrate 105. Minimizing the lattice mismatch between the release layer 110 and the substrate 105 advantageously reduces or eliminates, for example, cracking and/or defect introduction in the release layer 110 and island formation (i.e., three-dimensional growth) during growth of the release layer 110. In various embodiments, the lattice mismatch between the release layer 110 and the substrate 105 is less than ±3%, less than ±1%, or less than ±0.2%. In various embodiments, it may be preferable to reduce the lattice mismatch when the release layer 110 is tensilely strained (i.e., the in-plane lattice spacing is smaller than that of substrate 105) in order to minimize or eliminate stress-relieving cracking in the release layer 110. In various embodiments, when the release layer 110 is compressively strained, the lattice mismatch to the substrate 105 may be larger but may be a function of the thickness of release layer 110. For example, compressively strained release layers 110 having too much lattice mismatch to the substrate 105 and too large a thickness may island during layer growth. Thus, in various embodiments, a release layer 110 having a compressive lattice mismatch with substrate 105 of approximately 3% may have a thickness no more than approximately 10 nm. For layers with less lattice mismatch, the thickness may be larger.

In various embodiments, the release layer 110 includes, consists essentially of, or consists of AlN doped with one or more impurities that form an absorption band within the release layer 110 for a wavelength of light not strongly absorbed by the substrate 105 itself. For example, the release layer 110 may include, consist essentially of, or consist of AlN doped with oxygen, which has an absorption band at approximately 310 nm. Since the AlN substrate 105 does not strongly absorb light having wavelengths larger than approximately 300 nm, absorption of light within, and concomitant local heating of, the release layer 110 may be utilized to remove the substrate 105 from the device structure 100. In various embodiments, the release layer 110 may be doped with oxygen and/or one or more other dopants, for example, carbon (C), iron (Fe), manganese (Mn), or gadolinium (Gd). In various embodiments, release layer 110 may include, consist essentially of, or consist of a semiconductor other than AlN (e.g., AlGaN) that is substantially lattice-matched to substrate 105, and which may contain one or more dopants forming one or more absorption bands for light that is not strongly absorbed by substrate 105. In various embodiments, the release layer 110 may include, consist essentially of, or consist of a nitride alloy containing one or more of boron, aluminum, gallium, and/or indium. The release layer 110 may even include, consist essentially of, or consist of silicon carbide or a metal nitride (in which the metal is, e.g., one or more of Sc, Y, La, Ti, or Ta).

Device structure 100 also includes an active light-emitting structure 115 disposed over the release layer 110 (or, in embodiments in which release layer 110 is not present, over the substrate 105), as shown in FIG. 1. For example, the active structure 115 may include a bottom contact layer 120. In various embodiments, the bottom contact layer 120 is n-type doped, e.g., doped with an impurity such as P, As, Sb, C, H, F, O, Mg, and/or Si. The bottom contact layer 120 may include, consist essentially of, or consist of, for example, AlN or $Al_xGa_{1-x}N$. In an embodiment, an optional graded buffer layer (not shown) is disposed above substrate 105 and below bottom contact layer 120. The graded buffer layer may include, consist essentially of, or consist of one or more semiconductor materials, e.g., $Al_xGa_{1-x}N$. In various embodiments, the graded buffer layer has a composition approximately equal to that of substrate 105 at the bottom interface of the graded buffer layer in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 120 may be chosen to be close to (e.g., approximately equal to) that of the desired active region of the device (e.g., the $Al_xGa_{1-x}N$ concentration that will result in the desired wavelength emission from the light-emitting device). In an embodiment, the graded buffer layer includes, consists essentially of, or consists of doped or undoped $Al_xGa_{1-x}N$ graded from an Al concentration x of approximately 100% to an Al concentration x of approximately 50%, approximately 60%, approximately 70%, or approximately 80%.

The bottom contact layer 120 may have a thickness sufficient to prevent current crowding after device fabrication and/or to stop on during etching to fabricate contacts. For example, the thickness of bottom contact layer 120 may range from approximately 100 nm to approximately 500 nm, or from approximately 100 nm to approximately 2 µm. When utilizing a bottom contact layer 120, the final light-emitting device may be fabricated with back-side contacts. In various embodiments, bottom contact layer 120 will have high electrical conductivity even with a small thickness due to the low defect density maintained when the layer is pseudomorphic. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

Active structure 115 is configured for the emission of light in response to an applied voltage. Thus, the active structure 115 may include a multiple-quantum well ("MQW") layer 125 disposed above bottom contact layer 120. In various embodiments, MQW layer 125 is disposed directly on the bottom contact layer 120. In other embodiments, an optional layer (e.g., an undoped layer including, consisting essentially of, or consisting of an undoped semiconductor material such as AlGaN) may be disposed between the bottom contact layer 120 and the MQW layer 125. The MQW layer 125 may be doped with the same doping polarity as the bottom contact layer 120, e.g., n-type doped. The MQW layer 125 may include, consist essentially of, or consist of one or more quantum wells separated by (or surrounded on both sides by) barriers. For example, each period of MQW layer 125 may feature an $Al_xGa_{1-x}N$ quantum well and an $Al_yGa_{1-y}N$ barrier, where x is different from y. Typically, y may be greater than 0.7, or even greater than 0.9 for devices designed to emit at wavelengths shorter than 250 nm. The value of x will, at least in part, determine the emission wavelength of the device. For example, for emission wavelengths shorter than 250 nm, x may be greater than 0.6. In various embodiments of the invention, x is selected such that the emission wavelength of the device is approximately 240 nm or less, approximately 230 nm or less, or even approximately 215 nm or less. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.6 and y is approximately 0.85. MQW layer 125 may include a plurality of such periods, and may have a total thickness ranging from 20 nm to 100 nm, or less than approximately 50 nm.

In various embodiments of the invention, an electron-blocking layer 130 may be disposed over MQW layer 125. The electron-blocking layer 130 typically has a wider band gap than that of a band gap within the MQW layer 125 (e.g., a band gap of the barrier layers therewithin). In various embodiments, the electron-blocking layer 130 may include, consist essentially of, or consist of e.g., $Al_xGa_{1-x}N$ or AlN, and electron-blocking layer 130 may be doped. For example, the electron-blocking layer 130 may be doped with the same doping polarity as that of bottom contact layer 120 and/or MQW layer 125 (e.g., n-type doped). In various embodiments, the value of x in the electron-blocking layer 130 is greater than the value of the Al mole fraction in the barrier layers used in the MQW layer 125. Thus, x may be greater than 0.7 for shorter wavelength devices. It may even be greater than 0.9 for devices designed to emit at wavelengths shorter than 250 nm or shorter than 240 nm. Electron-blocking layer 130 may have a thickness that may range, for example, between approximately 10 nm and approximately 50 nm, or even between approximately 10 nm and approximately 30 nm. In various embodiments of the invention, the electron-blocking layer 130 is sufficiently thin (e.g., thickness less than about 30 nm, or less than about 20 nm) so as to facilitate carrier (e.g., hole) tunneling through the electron-blocking layer 130. In various embodiments of the invention, the electron-blocking layer 130 is omitted from device structure 100.

As shown in FIG. 1, device structure 100 may also include a graded layer 135 disposed above the electron-blocking layer 130 (or above the MQW layer 125 in embodiments in which electron-blocking layer 130 is omitted), and a cap layer 140 may be disposed over the graded layer 135. The cap layer 140 may be doped with a doping polarity opposite of that of the bottom contact layer 120, e.g., p-type doped with one or more dopants such as Mg, Be, and/or Zn. In other embodiments, the cap layer 140 may be undoped, as carriers (e.g., holes) may be injected from an electrode into a two-dimensional carrier gas disposed at the interface between the cap layer 140 and the graded layer 135. (While in exemplary embodiments described herein the cap layer 140 is doped p-type and the bottom contact layer 120 is doped n-type, embodiments in which the doping polarities of these layers are switched are within the scope of the present invention; in such embodiments, the electron-blocking layer 130, if present, may be considered to be a "hole-blocking layer," as understood by those of skill in the art.) The cap layer 140 may have a thickness ranging from, e.g., approximately 1 nm to approximately 100 nm, or approximately 1 nm to approximately 50 nm, or approximately 1 nm to approximately 20 nm. In various embodiments, the cap layer 140 includes, consists essentially of, or consists of $Al_xGa_{1-x}N$, and in various embodiments the aluminum concentration x may range from 0 (i.e., pure GaN) to approximately 0.2.

The device structure 100 may also incorporate a metallic contact to facilitate electrical contact to the device. For example, the metallic contact may include or consist essentially of an electrode layer 145 disposed above or on the cap layer 140. The composition and/or shape of the electrode layer 145 are not particularly limited as long as it enables the injection of carriers (e.g., holes) into the cap layer 140. In embodiments in which holes are injected into a p-type doped nitride-based semiconductor cap layer 140, the electrode layer 145 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Electrode layers 145 in accordance with embodiments of the invention are not limited to these materials. The thickness of the electrode layer 145 may be, for example, between approximately 10 nm and approximately 100 nm, or between approximately 10 nm and approximately 50 nm, or between approximately 10 nm and approximately 30 nm, or between approximately 25 nm and approximately 40 nm. In various embodiments, the electrode layer 145 is formed after removal of all or a portion of the substrate 105 and/or after patterning of the device structure 100 to form mesas with angled sidewalls, as described in further detail below.

As mentioned above, embodiments of the present invention feature a graded layer 135 disposed between the cap layer 140 and the electron-blocking layer 130 (or the MQW layer 115 in embodiments in which the electron-blocking layer 130 is omitted). The graded layer 135 typically includes, consists essentially of, or consists of a nitride semiconductor, e.g., a mixture or alloy of Ga, In, and/or Al with N. The compositional gradient within graded layer 135 may be substantially continuous or stepped, and the grading rate within the graded layer 135 may be substantially constant or may change one or more times within the thickness of graded layer 135. The graded layer 135 may be undoped. In other embodiments, the graded layer 135 is doped n-type or p-type with one or more dopants, e.g., C, H, F, O, Mg, Be, Zn, and/or Si. The thickness of the graded layer 135 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 100 may be temporarily halted between growth of the graded layer 135 and the underlying layer and/or the overlying layer. In various embodiments, the graded layer 135 is pseudomorphically strained to one or more of the underlying layers.

In various embodiments of the invention, one or more (or even all) of the layers of device structure 100 formed over substrate 105 may be pseudomorphically strained, similar to device layers described in U.S. patent application Ser. No. 12/020,006, filed on Jan. 25, 2008, U.S. patent application Ser. No. 12/764,584, filed on Apr. 21, 2010, and U.S. patent application Ser. No. 14/208,379, filed on Mar. 13, 2014, the entire disclosure of each of which is incorporated by reference herein. Thus, as detailed therein, in various embodiments, one or more of the layers of device structure 100 may be pseudomorphic and may have a thickness greater than its predicted (e.g., via the Maxwell-Blakeslee theory) critical thickness. Moreover, the collective layer structure of device structure 100 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 100 are pseudomorphically strained and cap layer 140 is partially or substantially fully relaxed. For example, the lattice mismatch between cap layer 140 and substrate 105 and/or MQW layer 135 may be greater than approximately 1%, greater than approximately 2%, or even greater than approximately 3%. In an exemplary embodiment, cap layer 140 includes, consists essentially of, or consists of undoped or doped GaN, substrate 105 includes, consists essentially of, or consists of doped or undoped AlN (e.g., single-crystal AlN), and MQW layer 125 includes, consists essentially of, or consists of multiple $Al_{0.75}Ga_{0.25}N$ quantum wells interleaved with $Al_{0.85}Ga_{0.15}N$ barrier layers, and cap layer 140 is lattice mismatched by approximately 2.4%. (In this exemplary embodiment, the MQW layer 125 is selected to emit light having a wavelength of approximately 235 nm.) Cap layer 140 may be substantially relaxed, i.e., may have a lattice parameter approximately equal to its theoretical unstrained lattice constant. A partially or substantially relaxed cap layer 140 may contain strain-relieving dislocations having segments threading to the surface of cap layer 140 (such dislocations may be termed "threading dislocations"). The threading dislocation density of a relaxed cap layer 140 may be larger than that of substrate 105 and/or layers underlying cap layer 140 by, e.g., one, two, or three orders of magnitude, or even larger.

In accordance with embodiments of the present invention, the device structure 100 is patterned into one or more mesas having sidewalls, at least at the active structure 115, that form an angle with the substrate normal that is approximately the Brewster angle corresponding to the composition of active structure 115 and the emission wavelength thereof. As mentioned previously, the Brewster angle may be calculated using the formula:

$$\theta_B = \tan^{-1}\frac{n_2}{n_1}$$

where $\theta_B$ is the Brewster angle, $n_1$ is the refractive index of the medium through which the light initially propagates (e.g., the active structure 115 or a portion thereof such as MQW layer 125), and $n_2$ is the refractive index of the medium into which the light is emitted (e.g., air having a refractive index of 1). For example, an AlGaN device structure fabricated on an AlN substrate and configured to emit light at 230 nm has a Brewster angle of about 21.7°. Indices of refraction of nitride layers such as AlN and AlGaN (i.e., of varying Al content), as a function of wavelength, and therefore Brewster angles, may be straightforwardly determined by those of skill in the art via, for example, spectroscopic ellipsometry measurements (using, e.g., the UVISEL 2 VUV spectroscopic ellipsometer available from Horiba, Ltd. of Kyoto, Japan). As known to those of skill in the art, the Brewster angle is the angle at which light that has its electric field polarized in the same plane as a potential reflection will be completely transmitted across the potentially reflecting surface or interface without reflection.

Figure 2A:
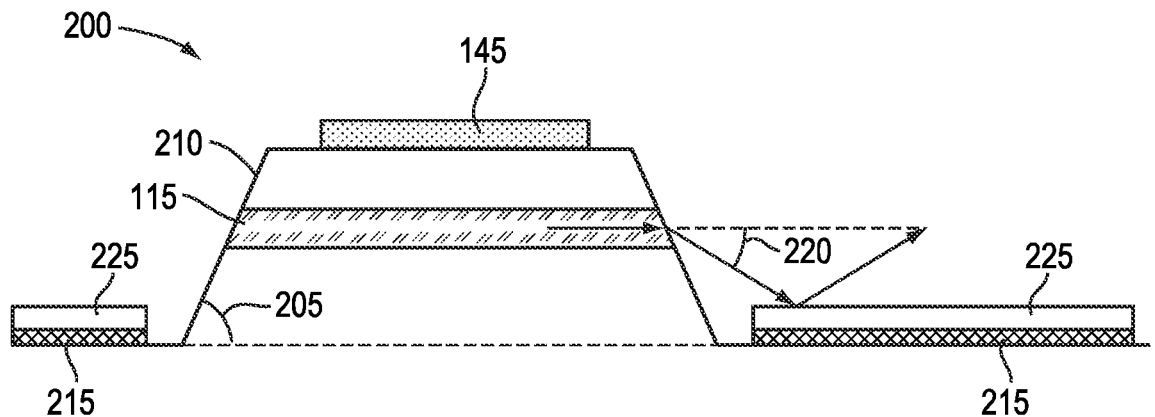
FIG. 2A is a schematic cross-section of a light-emitting device structure in accordance with various embodiments of the invention.

Once the desired sidewall angle for the device mesa is determined, the device structure 100 is patterned (e.g., by conventional photolithography processes) to define one or more areas corresponding to the desired mesas, and then the device structure 100 is etched to form mesas 200, as shown in FIG. 2A. Formation of mesas 200 having a desired sidewall angle 205 may be straightforwardly performed by one of skill in the art using, for example, a hybrid etching technique as described in T. Sakai, et al., "On-wafer fabrication of etched-mirror UV-C laser diodes with the ALD-deposited DBR," Appl. Phys. Lett. 116, 122101 (2020), the entire disclosure of which is incorporated by reference herein. For example, in accordance with embodiments of the present invention, areas corresponding to the desired mesas 200 may be masked with an etching mask (which is deposited and patterned to reveal areas between mesas, as known in the art) that may include, consist essentially of, or consist of, e.g., silicon dioxide and/or another insulating material. The revealed areas may then initially be etched (e.g., down to the bottom contact layer or to the substrate) via reactive-ion etching (e.g., via $Cl_2$ and $BCl_3$ inductive-coupled-plasma reactive-ion etching), thereby revealing mesa sidewalls 210. The initial mesa sidewall thereby achieved may be selected, at least in part, via selection of the thickness of the etch mask. In accordance with various embodiments, since the etch process may not be fully selective between the mask and the mesa, this initial etch may result in a mesa sidewall 210 that is not vertical. For example, for a 500-nm-thick $SiO_2$ etch mask, the dry etching may result in a tilt angle of 30° to the [0001] direction. In various embodiments, this single-step dry etching process may be utilized alone to select the desired sidewall angle 205 of the mesas 200.

In accordance with various embodiments of the invention, after the initial dry etch, the mesa sidewalls 210 may be etched in a wet etchant for an etching time selected to achieve the desired final sidewall angle 205. For example, in various embodiments of the invention, 25% tetramethylammonium hydride (TMAH) may be utilized as a wet etchant (at an etching temperature of, e.g., approximately 80° C.) to alter the sidewall angle 205. Since the TMAH etchant is selective to ($1\bar{1}00$) facets, the wet etching time may be selected to alter the sidewall angle 205 between that achieved in the first dry etching step and a substantially vertical sidewall. In this manner, the sidewall angle 205 corresponding to the Brewster angle of the device structure may be achieved by one of skill in the art without undue experimentation.

In order to facilitate the formation of bottom contacts 215, the device structure 100 may be etched to reveal the bottom contact layer 120, and metal contacts may be made thereto between the etched mesas 200. As also shown in FIG. 2A, a top contact 145 may be formed over the top of the mesa 200, and the top contact 145 may either be formed and in place (and protected by a mask of, e.g., photoresist or silicon dioxide) prior to the mesa-formation etch, or the top contact 145 may be formed after mesa formation. In various embodiments, bottom contacts 215 (and/or top contacts 145) may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO).

FIG. 2A depicts an exemplary embodiment in which the active device structure 115 is configured for emission of UV light having a wavelength of approximately 230 nm, corresponding to a Brewster angle of approximately 22°. As shown, the mesa sidewall 210 thus forms an angle 205 to the substrate normal of approximately 22°, i.e., an angle 205 to the substrate (or bottom contact layer) surface of approximately 68°, thereby maximizing lateral emission of TM-polarized photons from the mesa edges. As also shown in FIG. 2A, the laterally emitted photons will typically be emitted at an angle 220 to the substrate (or bottom contact layer) surface (e.g., the c-plane), and this angle of emission 220 may be determined using the Fresnel equations, which, as known to those of skill in the art, describe the behavior of light as it is transmitted between media of different refractive indices. As shown in the example embodiment depicted in FIG. 2A, light emitted at a wavelength of 230 nm will emerge from the mesa sidewall having an angle to the substrate normal of approximately 22° at a downward angle of approximately 47° with respect to the substrate plane. Thus, in embodiments of the present invention, UV reflectors 225 are formed between the mesas (e.g., over the bottom contacts) in order to reflect the emitted light upward away from the substrate (or bottom contact layer). Depending upon the wavelength of light emitted by the device structure 100, the reflector 225 may include, consist essentially of, or consist of, for example, Al, a multi-layer dielectric film, and/or one or more fluoroplastics (e.g., polytetrafluoroethylene (PTFE)), although embodiments of the invention are not limited to such materials. For example, Al is substantially reflective to various wavelengths of UV light (e.g., >90% reflectivity to light having a wavelength of approximately 265 nm). While FIG. 2A depicts the desired mesa sidewall angle 205 and angle 220 of light emission for light having a wavelength of 230 nm, embodiments of the invention include device structures having mesa angles and resulting emission angles corresponding to other UV wavelengths (e.g., wavelengths ranging from approximately 210 nm to approximately 300 nm, ranging from approximately 210 nm to approximately 270 nm, or ranging from approximately 210 nm to approximately 240 nm).

Figure 2B:
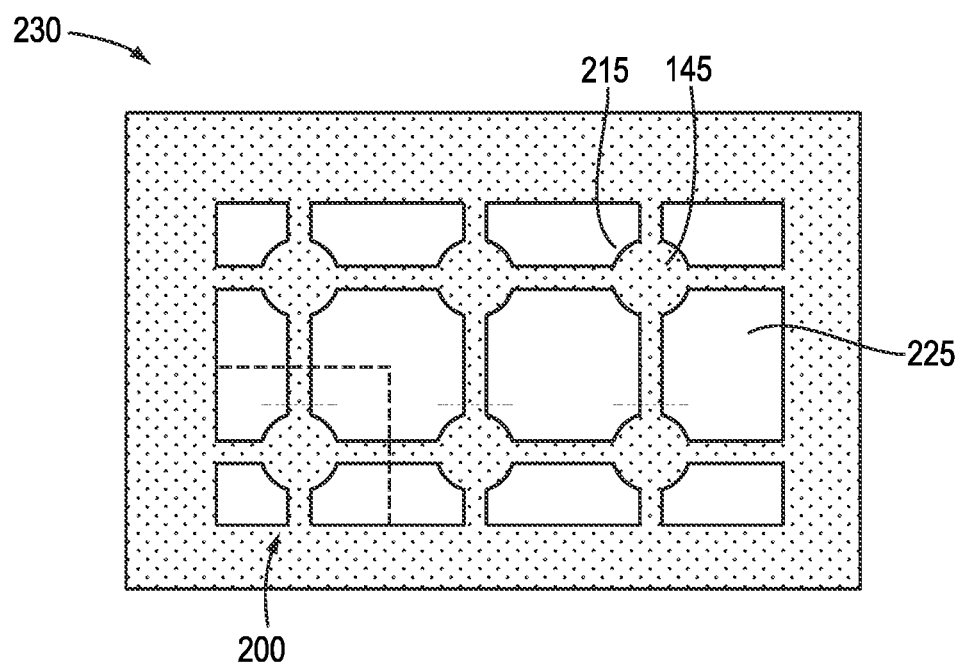
FIG. 2B is a schematic plan view of the light-emitting device structure of FIG. 2A in accordance with various embodiments of the invention.

As also shown in the plan-view of the resulting device structure 230 in FIG. 2B, the top contacts 145 of the etched mesas 200 may be electrically coupled together while being insulated from the bottom contact 215 that extends between the various mesas 200. For example, an insulating layer may be formed over the bottom contact 215 for such insulation, at least in areas where the top contact material 145 extends between mesas to electrically couple the various mesas 200 together. Thus, device structures 230 may include two or more mesas or device structures 200 electrically connected together, where UV light is emitted from each of the mesas 200 during operation.

Figure 3A:
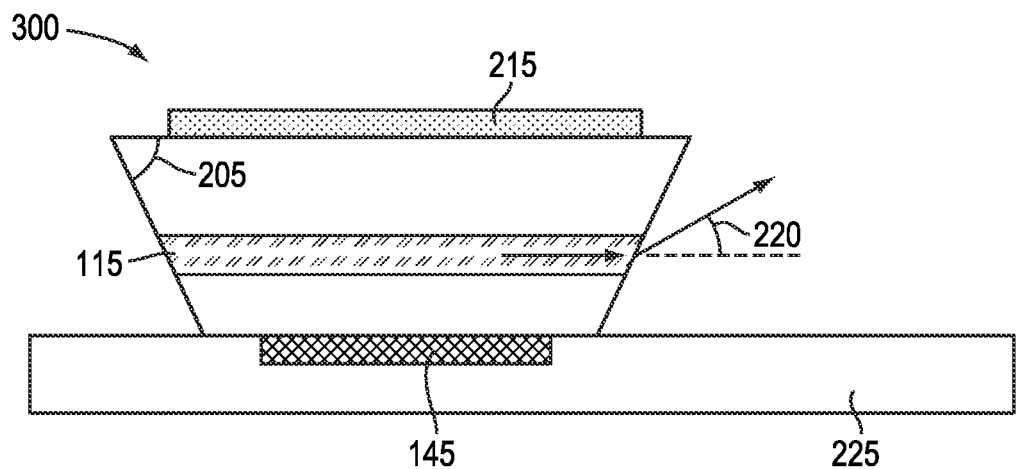
FIG. 3A is a schematic cross-section of a light-emitting device structure in accordance with various embodiments of the invention.

As shown in FIG. 3A, the substrate may be removed from beneath the mesa structure shown in FIG. 2A in order to reduce absorption of emitted light by the substrate (and/or one or more layers between the substrate and the light-emitting structure 115). For example, after definition of one or more mesas, the device structure 200 may be bonded to a handle wafer, and all or part of the substrate 105 may be removed. The substrate 105 may be removed via, e.g., grinding and/or polishing processes, which may remove the substrate 105 until, in various embodiments, only the one or more mesas remain bonded to the handle wafer. In various embodiments, one or more layers between the substrate 105 and the bottom contact layer may also be removed. Thereafter, a bottom contact 215 may be formed directly onto the revealed bottom of the mesa, as shown in FIG. 3A. As also shown in FIG. 3A, a UV reflector 225 may be disposed over the "top" of the mesa structure, and this UV reflector 225 may be disposed on the handle wafer before or after the mesa is bonded thereto. The handle wafer may include, consist essentially of, or consist of, for example, one or more semiconductor materials, sapphire, quartz, etc. Since the original substrate 105, or at least a portion thereof, is removed, the resulting device structure 300 may be flipped, such that the handle wafer or UV reflector 225 is the "bottom" of the structure; as shown, laterally emitted light from the mesa may then be emitted at an angle 220 "upward" toward the original substrate side (FIG. 3A depicts an embodiment in which the light has a wavelength of 230 nm and emerges at an angle 220 of 47°). Any light emitted toward the "bottom" of the structure may be reflected by the UV reflector 225.

In other embodiments, the original device structure 100 may incorporate a release layer 110 as described above, and various techniques may be used for removal of the substrate 105 and/or one or more overlying layers, as detailed in U.S. patent application Ser. No. 15/977,031, filed on May 11, 2018, the entire disclosure of which is incorporated by reference herein.

Figure 4:
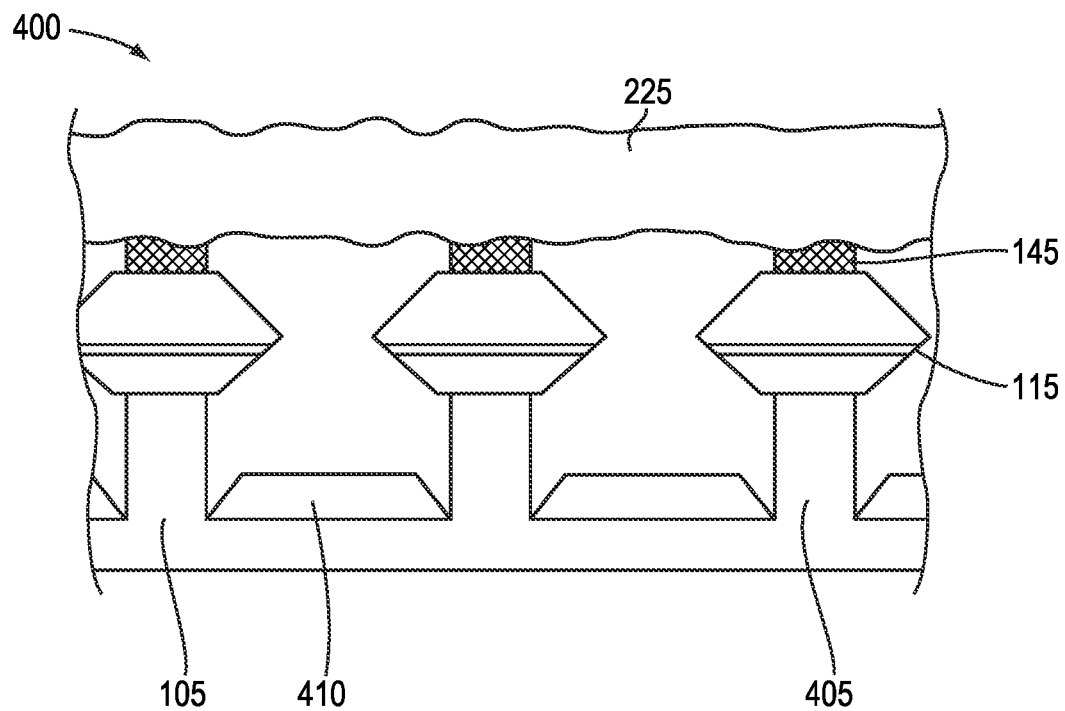
FIG. 4 is a schematic cross-section of a light-emitting device structure in accordance with various embodiments of the invention.

In various embodiments, device structures having sidewalls of approximately the Brewster angle may be epitaxially grown directly on patterned substrates, obviating the need for etching processes to form the sidewalls. As shown in FIG. 4, a device structure 400 may be formed on the top surface of substrate 105 that has been patterned to include one or more trenches, mesas, recesses, and/or projections 405 that provide the top surface of substrate 105 with a non-planar topography. For example, portions of the top surface of substrate 105 may be covered with a masking material (e.g., via conventional photolithography processes), and other portions of the top surface may be removed by, e.g., wet and/or plasma etching. As shown, when active structure 115 is grown over the patterned substrate 105, the epitaxial layers grow both vertically and laterally, and one or more epitaxial growth parameters may be determined and/or varied during the growth to ensure that the device structure grown on each of the substrate pillars 405 has sidewalls having an angle α with respect to the substrate plane of approximately the Brewster angle for the active structure 115 and its emission wavelength. In various embodiments, epitaxial growth parameters that may be determined and/or varied include growth temperature, pressure, and V/III ratio of the deposition precursor mix. Exemplary embodiments include those detailed in V. Jindal, et al., "Theoretical prediction of GaN nanostructure equilibrium and nonequilibrium shapes," Journal of Applied Physics 106, 083115 (2009), the entire disclosure of which is incorporated by reference herein.

When the device structures 400 are grown over the substrate pillars 405, epitaxial material 410 may also be deposited between the pillars, as shown in FIG. 4. As also shown in FIG. 4, the epitaxial growth parameters may be varied prior to neighboring device structures coming into contact and growing together as a unitary structure, thereby preserving gaps between the various device structures from which light emitted by the device structures may be freely emitted. As shown, a top contact 145 may be formed above each device structure, and a UV reflector 225 may be formed thereover.

In various embodiments, the UV reflector 225 may be disposed on a handle wafer, and therefore may extend between the different device "pillars" when the epitaxially grown structures are bonded to the handle wafer. For example, the UV reflector 225 (and/or other device structures detailed herein) may be attached to a handle wafer via a bonding layer, which may include, consist essentially of, or consist of, e.g., an adhesive, photoresist (e.g., SU-8), glass frit, an organic material such as benzocyclobutene (BCB), etc. In various embodiments, the handle wafer may include, consist essentially of, or consist of any suitably rigid material, e.g., silicon, glass, quartz, or sapphire.

Figure 3B:
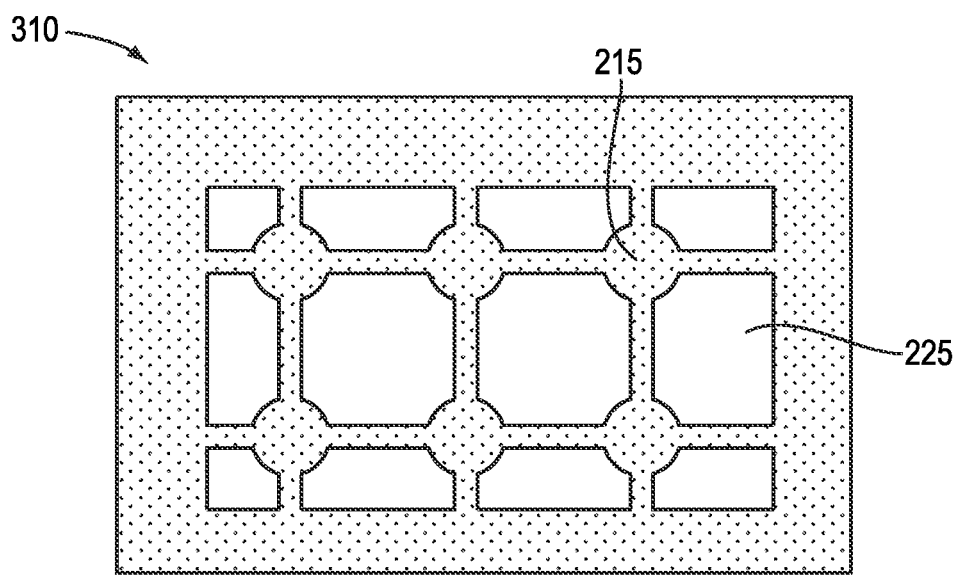
FIG. 3B is a schematic plan view of the light-emitting device structure of FIG. 3A in accordance with various embodiments of the invention.
Figure 5:
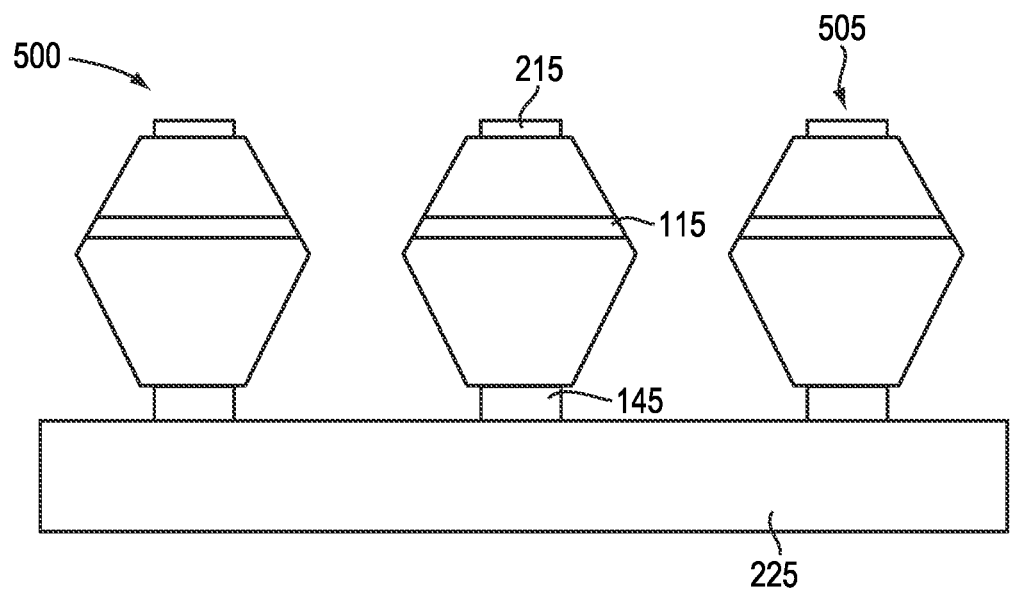
FIG. 5 is a schematic cross-section of a light-emitting device structure in accordance with various embodiments of the invention.

In embodiments utilizing a handle wafer, the original substrate 105, or a portion thereof (i.e., the entire substrate, including the patterned pillars, or the portion of the substrate disposed below the pillars) may be removed to reduce absorption of light therein. FIG. 5 schematically depicts the resulting device structure 500, which contains multiple discrete light-emitting features 505. As shown, contacts 215 may be formed opposite the "top" contacts 145 in the "flipped" device structure 500. As detailed above with respect to FIGS. 2B and 3B, the contacts of multiple features 505 may be electrically connected together such that the device structure 500 is configured to emit light from multiple features simultaneously. As discussed previously, light emitted toward the UV reflector 225 is reflected back away from the UV reflector 225 and any handle wafer disposed therebelow.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. An ultraviolet (UV) light-emitting device comprising:
   a substrate having an $Al_uGa_{1-u}N$ top surface, wherein $0.4 \leq u \leq 1.0$;
   a bottom contact layer disposed over the substrate, the bottom contact layer comprising $Al_nGa_{1-n}N$;
   a light-emitting device structure disposed over the bottom contact layer, the device structure comprising a multiple-quantum well layer comprising a plurality of periods each comprising a strained $Al_xGa_{1-x}N$ barrier and a strained $Al_yGa_{1-y}N$ quantum well, wherein (i) y is less than x by an amount facilitating confinement of charge carriers in the multiple-quantum well layer, and (ii) y is selected such that light emitted by the multiple-quantum well layer has a wavelength of approximately 240 nm or shorter; and a cap layer disposed over the multiple-quantum well layer, the cap layer comprising $Al_wGa_{1-w}N$, wherein $0 \leq w \leq 0.2$, wherein (i) at least a portion of a sidewall of the light-emitting device structure is angled with respect to a normal to the top surface of the substrate at an angle of approximately a Brewster angle of the light emitted by the multiple-quantum well layer, (ii) the light-emitting device structure is disposed within a mesa disposed over the substrate, at least a portion of the mesa having the sidewall angle, and (iii) the device further comprises a conductive bottom contact disposed over the bottom contact layer and around at least a portion of a base of the mesa.

2. The device of claim 1, wherein y is selected such that light emitted by the multiple-quantum well layer has a wavelength of approximately 210 nm or longer.

3. The device of claim 1, further comprising a UV reflector disposed over at least a portion of the bottom contact.

4. The device of claim 3, wherein the UV reflector comprises aluminum.

5. The device of claim 1, further comprising a conductive top contact disposed over the cap layer.

6. An ultraviolet (UV) light-emitting device comprising:
a substrate having an $Al_uGa_{1-u}N$ top surface, wherein $0.4 \leq u \leq 1.0$;
a bottom contact layer disposed over the substrate, the bottom contact layer comprising $Al_nGa_{1-n}N$; and
a plurality of mesas disposed over the bottom contact layer, each of the mesas comprising:
a light-emitting device structure comprising a multiple-quantum well layer comprising a plurality of periods each comprising a strained $Al_xGa_{1-x}N$ barrier and a strained $Al_yGa_{1-y}N$ quantum well, wherein (i) y is less than x by an amount facilitating confinement of charge carriers in the multiple-quantum well layer, and (ii) y is selected such that light emitted by the multiple-quantum well layer has a wavelength of approximately 240 nm or shorter, and
a cap layer disposed over the multiple-quantum well layer, the cap layer comprising $Al_wGa_{1-w}N$, wherein $0 \leq w \leq 0.2$; and
a conductive bottom contact disposed over the bottom contact layer and extending around at least a portion of a base of each of the mesas,
wherein at least a portion of a sidewall of each of the mesas is angled with respect to a normal to the top surface of the substrate at an angle of approximately a Brewster angle of the light emitted by the multiple-quantum well layer.

7. The device of claim 6, further comprising a conductive top contact disposed over the cap layer of each of the mesas, wherein the cap layers of the mesas are electrically coupled together.

8. The device of claim 6, wherein y is selected such that light emitted by the multiple-quantum well layer has a wavelength of approximately 210 nm or longer.

9. The device of claim 6, further comprising a UV reflector disposed over at least a portion of the bottom contact.

10. The device of claim 9, wherein the UV reflector comprises aluminum.

11. An ultraviolet (UV) light-emitting device comprising:
a handle wafer having a top surface;
a cap layer disposed over the handle wafer, the cap layer comprising $Al_wGa_{1-w}N$, wherein $0 \leq w \leq 0.2$;
a first conductive contact electrically coupled to the cap layer;
a light-emitting device structure disposed over the cap layer, the device structure comprising a multiple-quantum well layer comprising a plurality of periods each comprising a strained $Al_xGa_{1-x}N$ barrier and a strained $Al_yGa_{1-y}N$ quantum well, wherein (i) y is less than x by an amount facilitating confinement of charge carriers in the multiple-quantum well layer, and (ii) y is selected such that light emitted by the multiple-quantum well layer has a wavelength of approximately 240 nm or shorter;
a contact layer disposed over the light-emitting device structure, the contact layer comprising $Al_nGa_{1-n}N$; and
a UV reflector disposed over at least a portion of the first conductive contact,
wherein at least a portion of a sidewall of the light-emitting device structure is angled with respect to a normal to the top surface of the handle wafer at an angle of approximately a Brewster angle of the light emitted by the multiple-quantum well layer.

12. The device of claim 11, wherein y is selected such that light emitted by the multiple-quantum well layer has a wavelength of approximately 210 nm or longer.

13. The device of claim 11, further comprising a second conductive contact electrically coupled to the contact layer.

14. The device of claim 11, wherein the UV reflector comprises aluminum.

* * * * *